(12) United States Patent
Maeng et al.

(10) Patent No.: US 9,525,106 B2
(45) Date of Patent: Dec. 20, 2016

(54) SEMICONDUCTOR LIGHT EMITTING DEVICE

(71) Applicant: SAMSUNG ELECTRONICS CO., LTD., Suwon-si, Gyeonggi-do (KR)

(72) Inventors: Jong Sun Maeng, Suwon-si (KR); Jun Youn Kim, Hwaseong-si (KR); Sung Min Choi, Yongin-si (KR); Kyung Ho Yoo, Suwon-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/676,750

(22) Filed: Apr. 1, 2015

(65) Prior Publication Data
US 2016/0056325 A1 Feb. 25, 2016

(30) Foreign Application Priority Data

Aug. 19, 2014 (KR) ........................ 10-2014-0107873

(51) Int. Cl.
| H01L 29/06 | (2006.01) |
| H01L 33/32 | (2010.01) |
| H01L 33/06 | (2010.01) |
| H01L 33/14 | (2010.01) |

(52) U.S. Cl.
CPC ............. *H01L 33/325* (2013.01); *H01L 33/06* (2013.01); *H01L 33/145* (2013.01)

(58) Field of Classification Search
CPC ....... H01L 33/06; H01L 33/145; H01L 33/325
USPC .......................................................... 257/13
See application file for complete search history.

(56) References Cited

U.S. PATENT DOCUMENTS

| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |

(Continued)

FOREIGN PATENT DOCUMENTS

| CN | 103367581 A | 10/2013 |
| KR | 10-0541104 B1 | 1/2006 |

(Continued)

*Primary Examiner* — Douglas Menz
(74) *Attorney, Agent, or Firm* — Lee & Morse, P.C.

(57) ABSTRACT

A semiconductor light emitting device includes: an n-type semiconductor layer and a p-type semiconductor layer; an active layer disposed between the n-type semiconductor layer and the p-type semiconductor layer; and an electron blocking layer disposed between the active layer and the p-type semiconductor layer and doped with a p-type dopant element. The electron blocking layer is formed of $Al_xGa_{1-x}N$, where $0<x\leq1$. A plurality of first regions blocking overflow of electrons from the active layer to the p-type semiconductor layer and a plurality of second regions formed of InN are alternately disposed within the electron blocking layer.

20 Claims, 15 Drawing Sheets

(56) References Cited

U.S. PATENT DOCUMENTS

| | | |
|---|---|---|
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,044,383 B2 | 10/2011 | Zhong et al. |
| 8,049,161 B2 | 11/2011 | Sherrer et al. |
| 8,129,711 B2 | 3/2012 | Kang et al. |
| 8,179,938 B2 | 5/2012 | Kim |
| 8,227,819 B2 | 7/2012 | Zhong et al. |
| 8,263,987 B2 | 9/2012 | Choi et al. |
| 8,324,646 B2 | 12/2012 | Lee et al. |
| 8,379,684 B1 | 2/2013 | Bhat et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 2005/0179027 A1 | 8/2005 | Kim et al. |
| 2008/0042161 A1 | 2/2008 | Han et al. |
| 2009/0050874 A1 | 2/2009 | Kim et al. |
| 2010/0032649 A1 | 2/2010 | Lin et al. |
| 2012/0056156 A1 | 3/2012 | Kikuchi et al. |
| 2013/0299777 A1 | 11/2013 | Nakamura et al. |
| 2013/0341593 A1 | 12/2013 | Bergmann et al. |
| 2014/0034903 A1* | 2/2014 | Won ............... H01L 33/06 257/13 |
| 2014/0034958 A1 | 2/2014 | Lim et al. |
| 2014/0110720 A1 | 4/2014 | Choi et al. |

FOREIGN PATENT DOCUMENTS

| | | |
|---|---|---|
| KR | 10-0770441 B1 | 10/2007 |
| KR | 10-2013-0017357 A | 2/2013 |
| KR | 10-1267154 | 5/2013 |
| KR | 10-2014-0019508 A | 2/2014 |

\* cited by examiner

SEMICONDUCTOR LIGHT EMITTING DEVICE

CROSS-REFERENCE TO RELATED APPLICATION

This application claims priority under 35 U.S.C. §119 to Korean Patent Application No. 10-2014-0107873 filed on Aug. 19, 2014, with the Korean Intellectual Property Office, the disclosure of which is incorporated herein by reference.

BACKGROUND

The present disclosure relates to a semiconductor light emitting device.

A light emitting diode (LED), a type of semiconductor light emitting device, is a semiconductor device which emits light of various colors through the recombination of electrons and holes. Compared with a filament-based light emitting device, an LED has various advantages such as a longer lifespan, lower power consumption, superior initial driving characteristics, higher vibration resistance, and the like, and thus, demand for LEDs continues to grow. In particular, recently, a group III-nitride semiconductor which emits short-wavelength blue light has come to prominence.

SUMMARY

An aspect of the present disclosure may provide a semiconductor light emitting device with improved luminous efficiency.

An aspect of the present disclosure may also provide a semiconductor light emitting device with improved driving voltage characteristics.

According to an aspect of the present disclosure, a semiconductor light emitting device may include: an n-type semiconductor layer and a p-type semiconductor layer; an active layer disposed between the n-type semiconductor layer and the p-type semiconductor layer; and an electron blocking layer disposed between the active layer and the p-type semiconductor layer and doped with a p-type dopant element. The electron blocking layer may include a plurality of first regions formed of $Al_xGa_{1-x}N$, where $0<x\le1$, and a plurality of second regions formed of InN, which may be alternately disposed within the electron blocking layer.

The plurality of first and second regions may be alternately disposed to form a superlattice structure.

The electron blocking layer may further include a plurality of third regions formed of $Al_aIn_bGa_{1-a-b}N$, where $0\le a<x$, $0\le b<1$, and $0\le a+b<1$, and may be disposed between the first and second regions.

The content of aluminum (Al) of the third regions may decrease in a direction toward the second regions disposed contiguous therewith.

The content of indium (In) of the third regions may increase in a direction toward the second regions disposed contiguous therewith.

The plurality of first, second, and third regions may form a superlattice structure, the third regions being disposed between the plurality of first and second regions.

The semiconductor light emitting device may further include a diffusion barrier disposed between the active layer and the electron blocking layer to prevent the p-type dopant element from being diffused into the active layer.

The diffusion barrier may include an undoped semiconductor material formed of $Al_cIn_dGa_{1-c-d}N$, where $0\le c\le1$, $0\le d\le1$, and $0\le c+d\le1$.

The content of aluminum (Al) of the plurality of first regions may decrease in a direction from an interface of the electron blocking layer contiguous with the active layer toward an interface of the electron blocking layer contiguous with the p-type semiconductor layer.

The content of aluminum (Al) of the plurality of first regions may increase in a direction from an interface of the electron blocking layer contiguous with the active layer toward an interface of the electron blocking layer contiguous with the p-type semiconductor layer.

The p-type dopant element may include magnesium (Mg).

The semiconductor light emitting device may further include: a base semiconductor layer and a mask layer disposed on the base semiconductor layer, the mask layer including a plurality of openings exposing portions of the base semiconductor layer therethrough. The n-type semiconductor layer may include nanocores disposed in each of the exposed regions of the base semiconductor layer. The active layer, the electron blocking layer, and the p-type semiconductor layer may be sequentially disposed on lateral surfaces of the nanocores.

The base semiconductor layer may be formed of an n-type semiconductor material.

According to another aspect of the present disclosure, a semiconductor light emitting device may include: a first conductivity-type semiconductor layer; an active layer disposed on the first conductivity-type semiconductor layer; an electron blocking layer disposed on the active layer and doped with a second conductivity-type dopant element; and a second conductivity-type semiconductor layer disposed on the electron blocking layer. The electron blocking layer may include a plurality of first regions formed of $Al_xGa_{1-x}N$, where $0<x\le1$, and a plurality of second regions formed of InN and disposed between the plurality of first regions.

The first and second conductivity-type semiconductor layers may be formed of an n type and a p type semiconductor materials, respectively.

According to another aspect of the present disclosure, a semiconductor light emitting device may include: a first conductivity-type semiconductor layer and a second conductivity-type semiconductor layer; an active layer disposed between the first conductivity-type semiconductor layer and the second conductivity-type semiconductor layer; and an electron blocking layer disposed between the active layer and the second conductivity-type semiconductor layer. The electron blocking layer may include a plurality of first regions and a plurality of second regions alternately disposed. An energy band gap of the second conductivity-type semiconductor layer may be less than an energy band gap of the first regions and may be greater than an energy band gap of the second regions, wherein the second regions are formed of InN.

The energy band gap of the first regions may decrease in a direction from an interface of the electron blocking layer contiguous with the active layer toward an interface of the electron blocking layer contiguous with the second conductivity-type semiconductor layer, or increase in the direction from the interface of the electron blocking layer contiguous with the active layer toward the interface of the electron blocking layer contiguous with the second conductivity-type semiconductor layer.

The first regions may be formed of $Al_xGa_{1-x}N$, where $0<x\le1$.

The semiconductor light emitting device may further include a diffusion barrier disposed between the active layer and the electron blocking layer. The diffusion barrier may include an undoped semiconductor material formed of $Al_cIn_dGa_{1-c-d}N$, where $0≤c≤1$, $0≤d≤1$, and $0≤c+d≤1$. The content c of aluminum (Al) of the diffusion barrier may be less than the content x of aluminum (Al) contained in the first regions of the electron blocking layer.

The first regions may not substantially include indium (In) and the second regions may substantially include indium (In).

BRIEF DESCRIPTION OF DRAWINGS

The above and other aspects, features and other advantages in the present disclosure will be more clearly understood from the following detailed description taken in conjunction with the accompanying drawings, in which.

DETAILED DESCRIPTION

Figure 1:
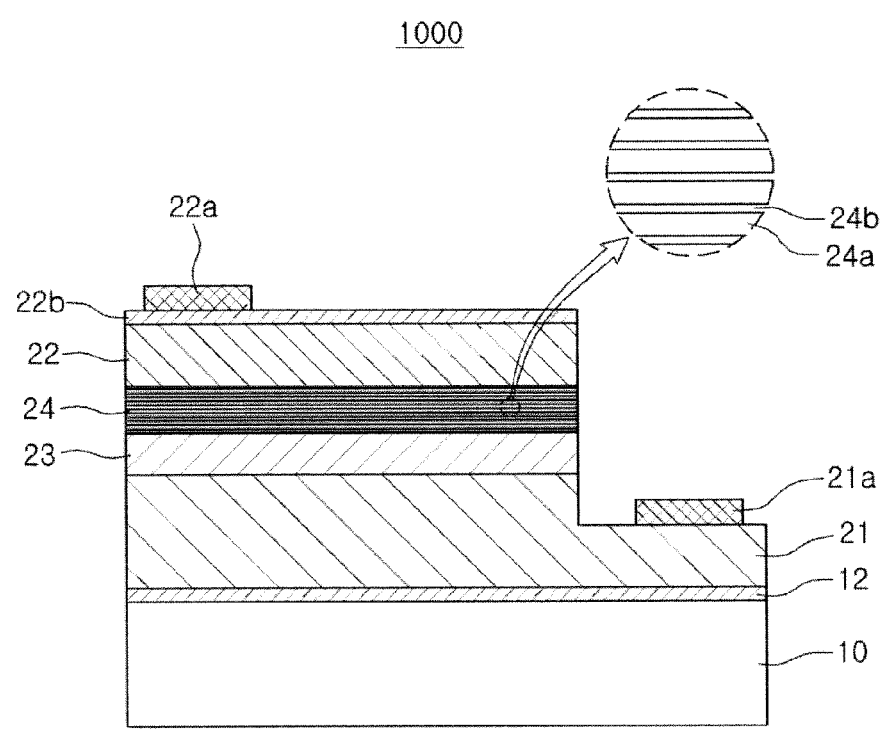
FIG. 1 is a cross-sectional view schematically illustrating a semiconductor light emitting device according to an exemplary embodiment of the present disclosure.

Hereinafter, exemplary embodiments of the present disclosure will be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art. Thus, in the drawings, the shapes and dimensions may be exaggerated for clarity. Thus, in the drawings, the shapes and dimensions of elements may be exaggerated for clarity, and the same reference numerals will be used throughout to designate the same or like elements. In this disclosure, terms such as "above", "upper portion", "upper surface", "below", "lower portion", "lower surface", "lateral surface", and the like, are determined based on the drawings, and in actuality, the terms may be changed according to a direction in which a semiconductor light emitting device is disposed.

Figure 2:
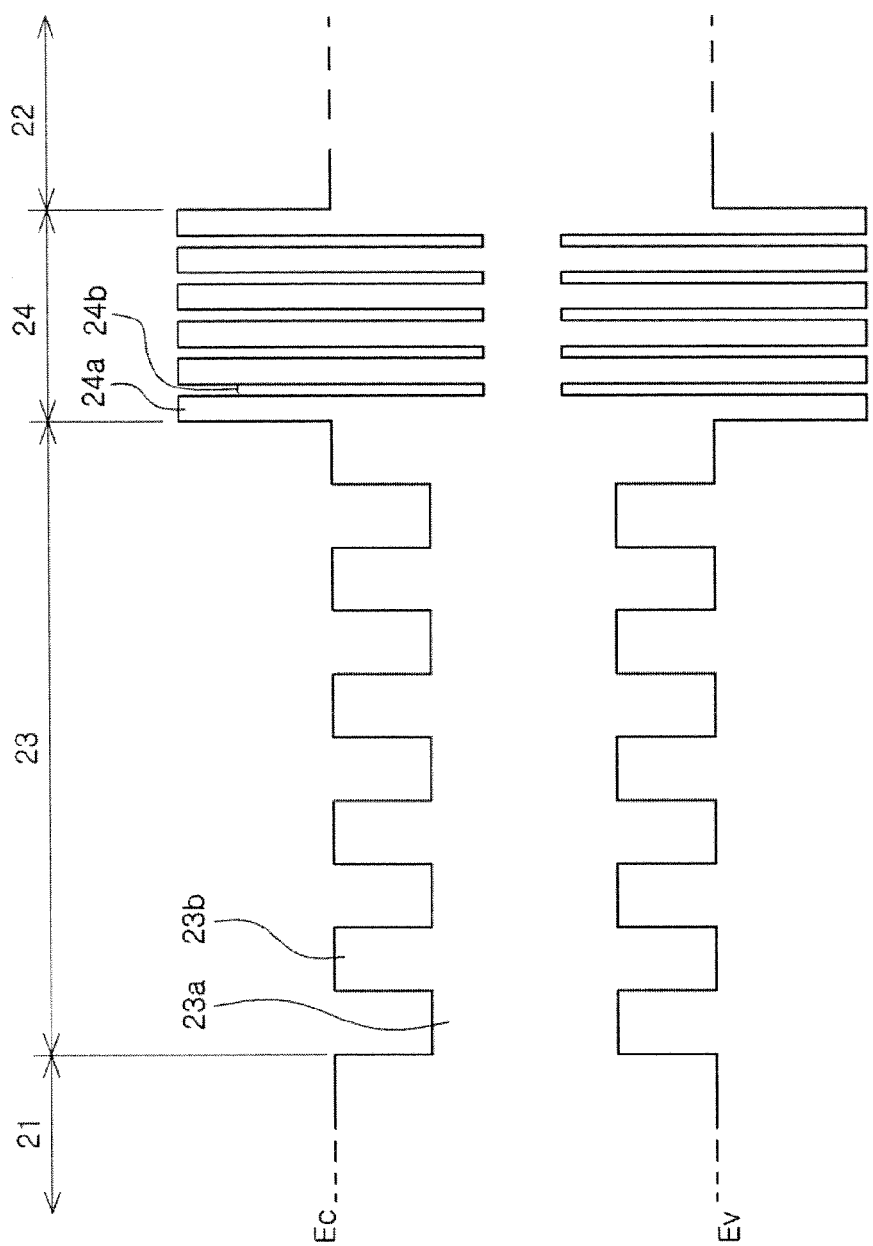
FIG. 2 is an energy band diagram of the semiconductor light emitting device according to the exemplary embodiment of FIG. 1.

FIG. 1 is a cross-sectional view schematically illustrating a semiconductor light emitting device 1000 according to an exemplary embodiment of the present disclosure, and FIG. 2 is an energy band diagram of the semiconductor light emitting device 1000 according to the exemplary embodiment of FIG. 1.

Referring to FIG. 1, a semiconductor light emitting device 1000 according to the present exemplary embodiment includes a substrate 10 and a first conductivity-type semiconductor layer 21 and a second conductivity-type semiconductor layer 22 formed on the substrate 10. In the present disclosure, although not limited hereto, the first conductivity-type semiconductor layer 21 and the second conductivity-type semiconductor layer 22 may be understood as designating an n-type semiconductor layer doped with an n-type dopant and a p-type semiconductor layer doped with a p-type dopant, respectively.

In the present exemplary embodiment, an active layer 23 may be disposed between the first and second conductivity-type semiconductor layers 21 and 22, and an electron blocking layer 24 may be disposed between the active layer 23 and the second conductivity-type semiconductor layer 22. First and second electrodes 21a and 22a may be formed on the first and second conductivity-type semiconductor layers 21 and 22 and electrically connected thereto, respectively.

The substrate 10 is provided as a semiconductor growth substrate and may be formed of an insulating, conductive, or semiconductive material such as sapphire, Si, SiC, $MgAl_2O_4$, MgO, $LiAlO_2$, $LiGaO_2$, or GaN. In this case, sapphire having electrical insulation characteristics may most preferably be used. Sapphire is a crystal having Hexa-Rhombo R3c symmetry and has a lattice constant of 13,001 Å along a c-axis and a lattice constant of 4,757 Å along an a-axis. Sapphire has a C (0001) plane, an A (11-20) plane, and an R (1-102) plane. In this case, the C plane is mainly used as a nitride growth substrate because it facilitates the growth of a nitride thin film and is stable at high temperatures.

Also, a silicon (Si) substrate may be appropriately used as the substrate 10. Mass-production may be facilitated by using the silicon (Si) substrate which may have a large diameter and may be relatively cheap. When the silicon (Si) substrate is used, a nucleation layer formed of a material such as AlGaN may be formed on the substrate 10 and a nitride semiconductor having a desired structure may be grown on the nucleation layer.

After a semiconductor stacked body including the first and second conductivity-type semiconductor layers 21 and 22 and the active layer 23 disposed therebetween is grown, the substrate 10 may be removed. For example, a sapphire substrate may be removed using a laser lift-off (LLO) process of irradiating a laser to the interface between the sapphire substrate and the semiconductor stacked body, and a silicon (Si) substrate or a silicon carbide (SiC) substrate may be removed through a method such as polishing or etching.

In the present exemplary embodiment, a buffer layer 12 may be interposed between the substrate 10 and the first conductivity-type semiconductor layer 21. In general, when a semiconductor stacked body is grown on the substrate 10, for example, when a GaN thin film is grown as the first conductivity-type semiconductor layer 21 on a heterogeneous substrate, a mismatch of lattice constants between the substrate 10 and the GaN thin film may cause a lattice defect such as dislocations, and a difference in coefficients of thermal expansion therebetween may cause the substrate 10 to be bowed (or warped) to result in the generation of cracks in the semiconductor stacked body. In order to control such defects and bowing (or warpage), the buffer layer 12 may be formed on the substrate 10 and a semiconductor stacked body having a desired structure, e.g., the first conductivity-type semiconductor layer 21 formed of a nitride semiconductor, may be grown on the buffer layer 12.

As a material for forming the buffer layer 12, $Al_mIn_nGa_{1-m-n}N$, where $0 \leq m \leq 1$ and $0 \leq n \leq 1$, in particular, GaN, AlN, or AlGaN, may be used. For example, the buffer layer 12 may be an undoped GaN layer, without a dopant, having a predetermined thickness.

Of course, the material of the buffer layer 12 is not limited thereto and any structure may be employed as long as it can enhance crystallinity of the semiconductor stacked body, and a material such as $ZrB_2$, $HfB_2$, ZrN, HfN, TiN, or ZnO may also be used. Also, a combination of a plurality of layers or a layer in which compositions thereof are gradually changed may also be used as the buffer layer 12.

The first and second conductivity-type semiconductor layers 21 and 22 may be formed of a nitride semiconductor, e.g., a material having a composition of $Al_pIn_qGa_{1-p-q}N$, where $0 \leq p \leq 1$, and $0 \leq p+q \leq 1$. In addition, the first and second conductivity-type semiconductor layers 21 and 22 may also be formed of a material such as an AlGaInP-based semiconductor or an AlGaAs-based semiconductor.

The active layer 23 is disposed between the first and second conductivity-type semiconductor layers 21 and 22 and may have a multi-quantum well (MQW) structure in which quantum well layers 23a and quantum barrier layers 23b are alternately stacked. For example, in the case of a nitride semiconductor, the quantum well layers 23a may be formed of InGaN (the contents of indium (In) and gallium (Ga) may be varied) and the quantum barrier layers 23b may be formed of GaN or InGaN (the contents of indium (In) and gallium (Ga) may be varied and the content of indium (In) may be lower than that of the quantum well layers 23a) or may be formed of AlInGaN (the contents of aluminum (Al), indium (In), and gallium (Ga) may be varied). The active layer 23 may emit light having a predetermined wavelength according to the recombination of electrons and holes Electrons moving from the first conductivity-type semiconductor layer 21 to the active layer 23 have higher mobility than that of holes, and thus, electrons may pass through the active layer 23 and may be introduced (overflow) to the second conductivity-type semiconductor layer 22 so as to be combined with holes in a region other than the active layer 23, namely, in a non-light emitting region. This is considered as a non-radiative recombination, which causes degradation of luminous efficiency of the semiconductor light emitting device.

In the present exemplary embodiment, in order to reduce non-radiative recombination, the electron blocking layer 24 may be provided between the active layer 23 and the second conductivity-type semiconductor layer 22.

Referring to FIG. 2 together with FIG. 1, the electron blocking layer 24 may include a plurality of first regions 24a formed of $Al_xGa_{1-x}N$, where $0 < x \leq 1$, and a plurality of second regions 24b formed of InN. The plurality of first regions 24a and the plurality of second regions 24b may be alternately disposed, which may be understood as a structure in which each of the plurality of second regions 24b is disposed between the plurality of first regions 24a, respectively. In order to block overflow of electrons from the active layer 23 to the p-type semiconductor layer (e.g., the second conductivity-type semiconductor layer 22), an energy band gap of the first regions 24a may be greater than that of the p-type semiconductor layer.

Although not limited hereto, the first regions 24a and the second regions 24b may be alternately disposed to form a superlattice structure.

In the present exemplary embodiment, the electron blocking layer 24 may have an improved effect on hole injection to the active layer 23 and have an energy band structure and a composition alleviating an influence of piezoelectric polarization, and thus, luminous efficiency and driving voltage characteristics of the semiconductor light emitting device 1000 may be improved. Here, the electron blocking layer 24 blocks overflow of electrons from the active layer 23 to the second conductivity-type semiconductor layer 22, but, conversely, the electron blocking layer 24 may hinder a movement of holes from the second conductivity-type semiconductor layer 22 to the active layer 23. In order to address this problem, the electron blocking layer 24 may be doped with a p-type dopant element. The p-type dopant element may be, for example, magnesium (Mg), but the element of the p-type dopant may not be limited thereto.

Doping the electron blocking layer 24 with a p-type dopant element may improve a hole injection effect, but, in general, an aluminum (Al) element contained in the electron blocking layer 24 causes deactivation of the p-type dopant, namely, hampers hole generation with the p-type dopant. Thus, the inventors of the present application propose an electron blocking layer 24 structure in which second regions 24b formed of InN are disposed between a plurality of first regions 24a. The second regions 24b may induce activation of the p-type dopant element within the electron blocking layer 24.

In detail, the indium (In) element contained in the semiconductor layer activates the p-type dopant element (activation refers to making the dopant atoms settle in a crystal position), and thus, when the second regions 24b formed of InN are disposed, a memory effect of the p-type dopant element may be reduced within the electron blocking layer 24, and even in the first and second regions 24a and 24b adjacent to the active layer 23, among the plurality of first and second regions 24a and 24b, the p-type dopant element may be effectively doped, compared with the case in which the second region 24b is not disposed.

Meanwhile, when the indium (In) element is contained in the semiconductor layer, energy band gap is reduced. Thus, in order to effectively block overflow of electrons, it is preferred for the first regions 24a not to substantially include indium (In). Here, when indium is not substantially included, it means that indium is not contained in the first region 24a at all or indium is doped not enough to substitute a gallium atom within an AlGaN crystal lattice of the first regions 24a, AlInGaN being formed thereby.

In addition, the electron blocking layer 24 according to the present exemplary embodiment may improve degradation in luminous efficiency caused by piezoelectric polarization due to a difference in lattice constants with the active layer 23.

Figure 3:
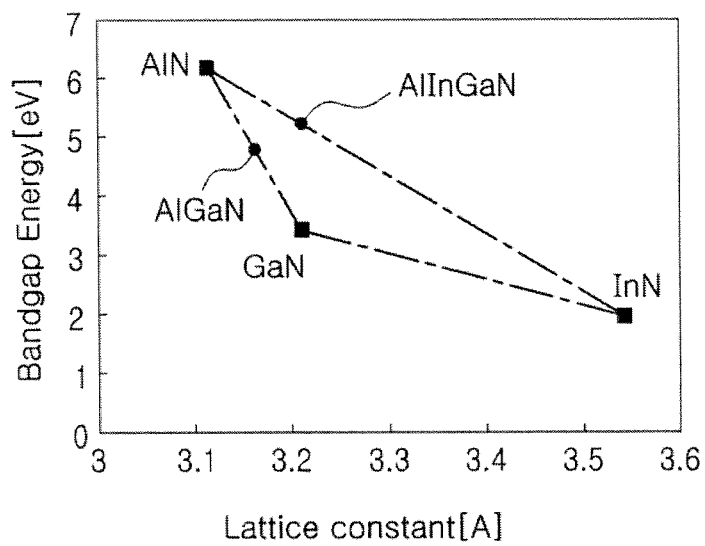
FIG. 3 is a graph illustrating energy band gaps and lattice constants according to each of the compounds.
Figure 4:
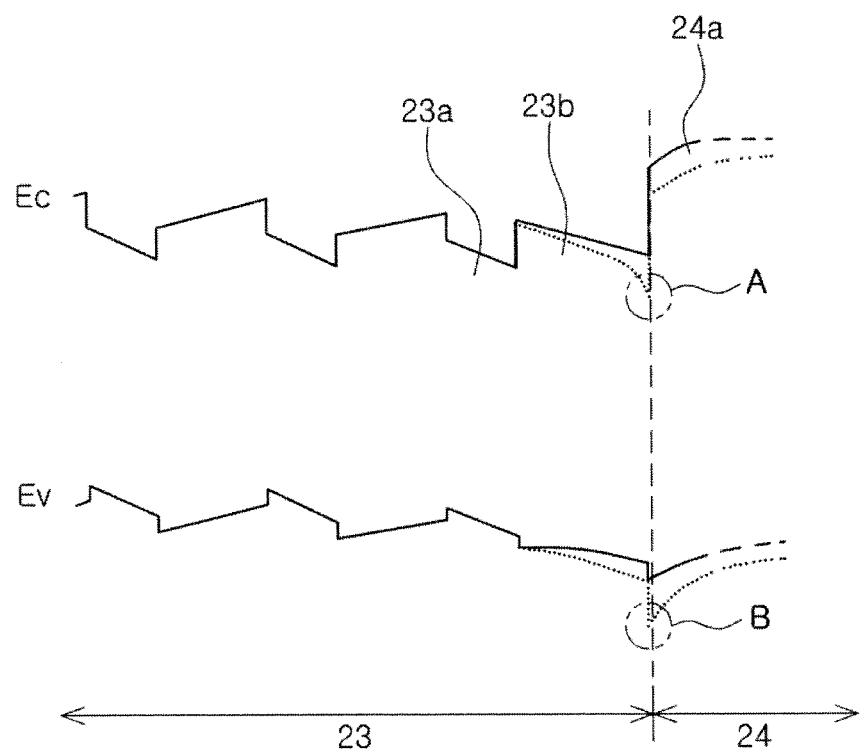
FIG. 4 is an energy band diagram illustrating characteristics of the semiconductor light emitting device according to an exemplary embodiment of the present disclosure.

FIG. 3 is a graph illustrating energy band gaps and lattice constants according to each of the compounds, and FIG. 4 is an energy band diagram illustrating characteristics of the semiconductor light emitting device 1000 according to an exemplary embodiment of the present disclosure.

In general, in a case of a nitride semiconductor, an internal electrical field may be generated by a piezoelectric polarization due to strain resulting from spontaneous polarization and mismatch of lattice constants between Ga atoms and N atoms.

Referring to FIG. 3, for example, piezoelectric polarization may occur due to strain resulting from a mismatch of lattice constants between the quantum barrier layers 23b formed of GaN and the electron blocking layer 24 formed of AlGaN, which causes an internal electric field to distort an energy band as illustrated in FIG. 4.

In detail, as illustrated in FIG. 4, a 2D electron gas layer is formed in a conduction band as indicated by the dotted line to aggravate an overflow phenomenon (please refer to 'A' in FIG. 4) and an energy barrier hampering hole movement into the active layer 23 may be formed in a valence band (please refer to 'B' in FIG. 4).

Meanwhile, in the present exemplary embodiment, in the electron blocking layer 24, the plurality of first regions 24a formed of AlGaN and the second regions 24b formed of InN are alternately disposed between the plurality of first regions 24a, whereby mismatch of lattice constants between the active layer 23 and the electron blocking layer 24 may be effectively resolved. For example, since the AlGaN regions (first region 24a) having a lattice constant smaller than that of GaN forming the quantum barrier layers 23b and the InN regions (second regions 24b) having a lattice constant greater than that of GaN are alternately disposed, a mismatch of lattice constants with the quantum barrier layers 23b may be alleviated. Thus, according to the present exemplary embodiment, as indicated by the solid lines in FIG. 4, distortion of an energy band may be reduced and driving voltage characteristics and luminous efficiency may be improved.

Referring to FIG. 3, in order to alleviate a problem due to mismatch of lattice constants between the active layer 23 and the electron blocking layer 24, a scheme of forming the electron blocking layer 24 with a semiconductor material formed of AlInGaN may be considered. However, the semiconductor material formed of AlInGaN requires a low temperature growth to effectively deposit (or evaporate) an indium (In) element, and in this case, it is difficult to secure excellent crystallinity.

Although not limited hereto, in order to secure excellent crystallinity of the semiconductor light emitting device 1000 according to the present disclosure, the inventors of the present application propose that the electron blocking layer 24 should be grown at high temperatures ranging from 750° C. to 1100° C.

Hereinafter, a method for manufacturing the semiconductor light emitting device 1000 according to the present exemplary embodiment will be described briefly. Here, descriptions of the same components as those of the previous exemplary embodiments will be omitted.

Figure 5:
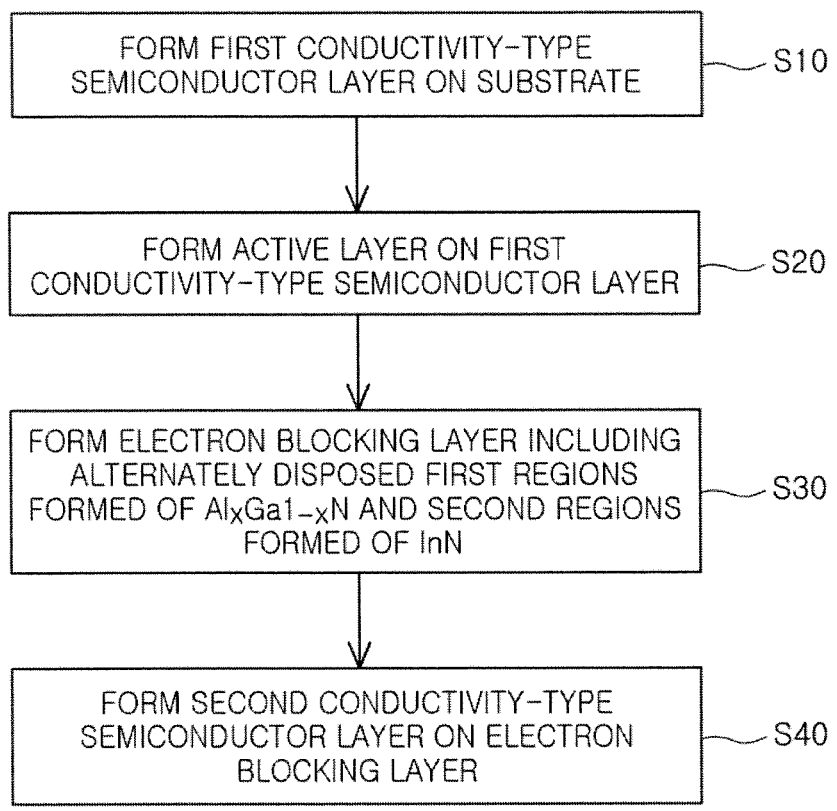
FIG. 5 is a flow chart illustrating a method for manufacturing a semiconductor light emitting device according to an exemplary embodiment of the present disclosure.

FIG. 5 is a flow chart illustrating a method for manufacturing a semiconductor light emitting device according to an exemplary embodiment of the present disclosure.

Referring to FIG. 5, the method for manufacturing the semiconductor light emitting device 1000 includes an operation (S10) of forming a first conductivity-type semiconductor layer 21 on a substrate 10, an operation (S20) of forming an active layer 23 on the first conductivity-type semiconductor layer 21, an operation (S30) of forming an electron blocking layer 24 on the active layer 23, and an operation (S40) of forming a second conductivity-type semiconductor layer 22 on the electron blocking layer 24.

The electron blocking layer 24 may include a plurality of first regions 24a formed of $Al_xGa_{1-x}N$, where $0<x\leq1$, blocking overflow of electrons from the active layer 23 to the p-type semiconductor layer and a plurality of second regions 24b formed of InN. The second regions 24b may induce activation of a p-type dopant element within the electron blocking layer 24. The first and second regions 24b may be alternately disposed.

The first and second conductivity-type semiconductor layers 21 and 22, the active layer 23, and the electron blocking layer 24 may be formed by using a semiconductor growth process such as metal organic chemical vapor deposition (MOCVD), hydride vapor phase epitaxy (HVPE), or molecular beam epitaxy (MBE).

The operation (S30) of forming the electron blocking layer 24 will be described in detail hereinafter. The operation (S30) may include an operation of alternately depositing the first regions 24a and the second regions 24b on the active layer 23.

The operation of depositing the first regions 24a may use, for example, TMGa, TEGa, TMAl, $Cp_2Mg$, $NH_3$, $H_2$, or $N_2$ as a reactive gas (or a source gas), and may include depositing a material layer formed of $Al_xGa_{1-x}N$, where $0<x\leq1$, at high temperatures ranging from 750° C. to 1100° C. through a known deposition process. Preferably, the material layer may be deposited at temperatures ranging from 900° C. to 1000° C.

The operation of depositing the second regions 24b may include depositing a material formed of InN through a known deposition process using, for example, TMIn, $Cp_2Mg$, $NH_3$, $H_2$, or $N_2$ as a reactive gas (or as a source gas). A deposition temperature may be high temperatures ranging from 750° C. to 1100° C., and, for example, ranging from 900° C. to 1000° C.

The first and second regions 24a and 24b may be deposited at the same temperature. However, the deposition temperature is not limited thereto and the first and second regions 24a and 24b may be deposited at different temperatures. For example, the first regions 24a may be deposited at a first temperature selected from a temperature range of 750° C. to 1100° C., and the second regions 24b may be deposited at a second temperature selected from a temperature range of 750° C. to 1100° C. Here, the second temperature may be lower than the first temperature.

When the electron blocking layer 24 is formed at high temperatures, a considerable portion of the second regions 24b formed of InN may be evaporated, but even in this case, an effect advantageous for activating the p-type dopant element due to an Indium (In) element may be maintained. Furthermore, the crystallinity on the basis of a high temperature growth process is better than that on the basis of a low temperature growth process, e.g. the growth process of the electron blocking layer 24 formed of AlInGaN, even though the evaporation of the considerable portion of the second regions 24b may slightly reduce alleviation of mismatch of lattice constants.

Hereinafter, the other components of the semiconductor light emitting device 1000 according to the present exemplary embodiment will be described with reference back to FIG. 1.

The semiconductor light emitting device 1000 may include the first and second electrodes 21a and 22a electrically connected to the first and second conductivity-type semiconductor layers 21 and 22, respectively. The first and second electrodes 21a and 22a may be provided as means for applying driving power to the semiconductor light emitting device 1000, and may be formed of an electrically conductive material known in the art, for example, a material selected from the group consisting of silver (Ag), aluminum (Al), nickel (Ni), chromium (Cr), palladium (Pd), copper (Cu), platinum (Pt), tin (Sn), tungsten (W), gold (Au), rhodium (Rh), iridium (Ir), ruthenium (Ru), magnesium (Mg), and zinc (Zn), and may be formed through a process such as deposition, sputtering, or plating. In addition, the first and second electrodes 21a and 22a may have a structure including two or more layers such as Ni/Ag, Zn/Ag, Ni/Al, Zn/Al, Pd/Ag, Pd/Al, Ir/Ag. Ir/Au, Pt/Ag, Pt/Al, or Ni/Ag/Pt. However, the materials of the first and second electrodes 21a and 22a are not limited thereto and any material may be used to form the first and second electrodes 21a and 22a as long as it has conductivity.

An ohmic-electrode layer 22b may be formed between the second conductivity-type semiconductor layer 22 and the second electrode 22a. The ohmic-electrode layer 22b may be formed of a material exhibiting electrical ohmic-characteristics with respect to the second conductivity-type semiconductor layer 22. In a case of a light emitting device having a structure in which light generated by the active layer 23 is emitted externally through the second conductivity-type semiconductor layer 22, the ohmic-electrode layer 22b may be formed of a transparent conductive oxide such as ITO, CIO, or ZnO having relatively good ohmic-contact performance, while having a high degree of light transmittance, among materials for a transparent electrode. However, the materials of the ohmic-electrode layer 22b are not limited thereto.

In addition, in a case of a light emitting device having a structure in which light generated by the active layer 23 is emitted externally through the first conductivity-type semiconductor layer 21, for example, in a case of a so-called flipchip type light emitting device in which the first and second electrodes 21a and 22a are mounted to face a lead frame, or the like, of a package, the ohmic-electrode layer 22b may be formed of a light reflective material, e.g., a highly reflective metal. However, the ohmic-electrode layer 22b is not an essential element in the present exemplary embodiment and may be excluded according to circumstances.

In the case of the structure illustrated in FIG. 1, the first and second electrodes 21a and 22a are disposed on the first conductivity-type semiconductor layer 21 and the ohmic-electrode layer 22b, respectively, but such an electrode formation scheme is merely an example and the first and second electrodes 21 and 22 may be formed in various positions of the semiconductor stacked body including the first and second conductivity-type semiconductor layers 21 and 22 and the active layer 23.

Figure 6A:
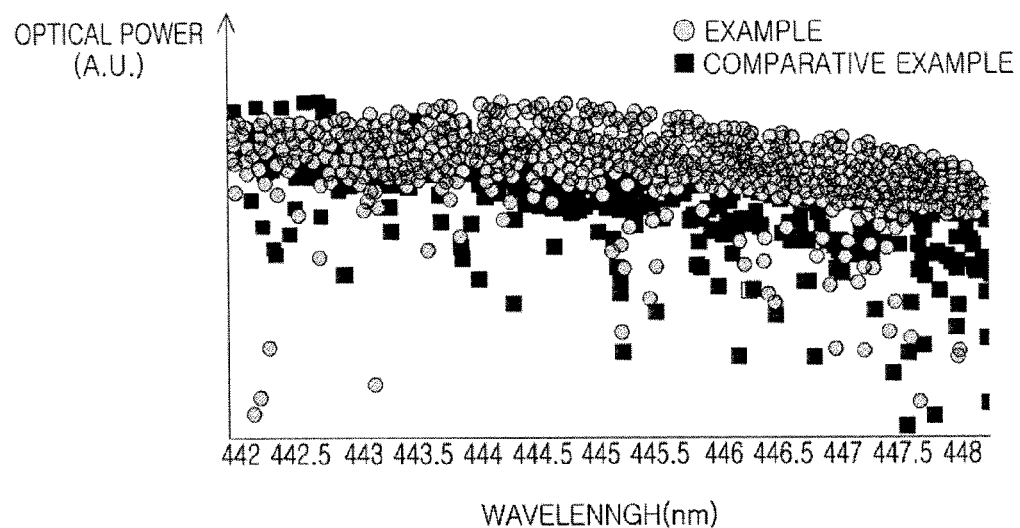
FIGS. 6A and 6B are graphs of comparative experiments illustrating improved characteristics of a semiconductor light emitting device according to an exemplary embodiment of the present disclosure.
Figure 6B:
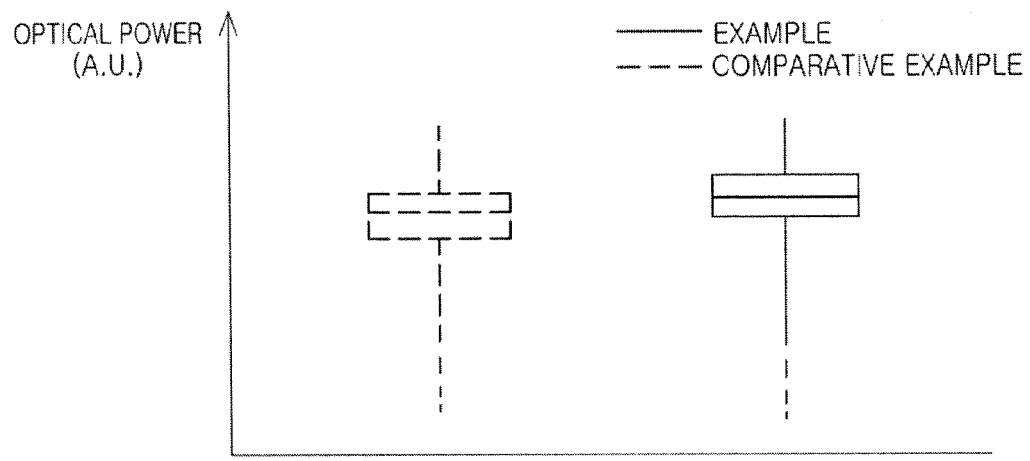

FIGS. 6A and 6B are graphs of comparative experiments illustrating improved characteristics of a semiconductor light emitting device according to an exemplary embodiment of the present disclosure.

In detail, the semiconductor light emitting device according to Example of FIGS. 6A and 6B included n-type and p-type semiconductor layers, an active layer disposed between the n-type and p-type semiconductor layers, and an electron blocking layer disposed between the active layer and the p-type semiconductor layer. The electron blocking layer included a plurality of first regions formed of $Al_{0.2}Ga_{0.8}N$ and a plurality of second regions formed of InN. The electron blocking layer was formed by alternately depositing the first regions and the second regions a plurality of times, and when a stacked structure of one first region and one second region is defined as a pair, stacked structure including a total of eight pairs was formed.

A semiconductor light emitting device used in Comparative Example was formed to be the same as that of Example, except for a configuration of a electron blocking layer. The electron blocking layer according to Comparative Example includes a structure in which $Al_{0.2}Ga_{0.8}N$ layers and GaN layers were alternately disposed. In detail, when a stacked structure of one $Al_{0.2}Ga_{0.8}N$ layer and one GaN layer is defined as a pair, a stacked structure including a total of eight pairs was formed.

As can be seen from FIG. 6A, the semiconductor light emitting device according to Example has enhanced optical power (measurement unit: mW) in most wavelength range of emitted light, compared with the semiconductor light emitting device according to Comparative Example, and also, as can be seen from FIG. 6A, optical power is improved on the whole. In particular, referring to the graph of comparative experiment of FIG. 6B, the inventors of the present application verified that overall optical power of the semiconductor light emitting device according to Example was approximately 0.4% higher than that of the semiconductor light emitting device according to Comparative Example.

Figure 7A:
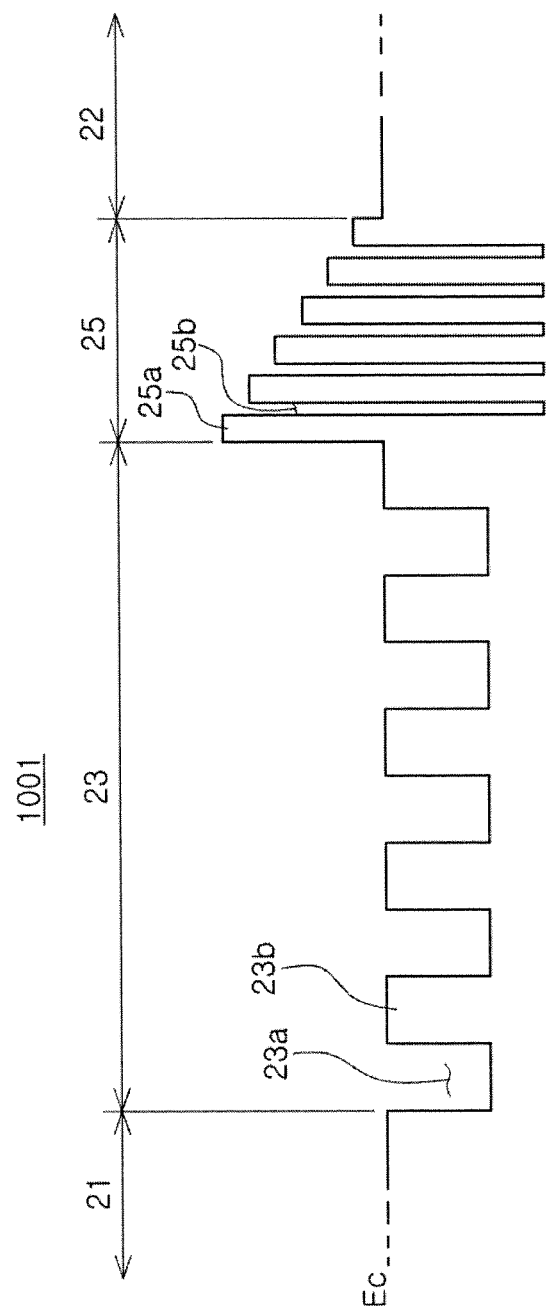
FIGS. 7A and 7B are energy band diagrams of semiconductor light emitting devices according to an exemplary embodiment of the present disclosure modified from FIG. 1.
Figure 7B:
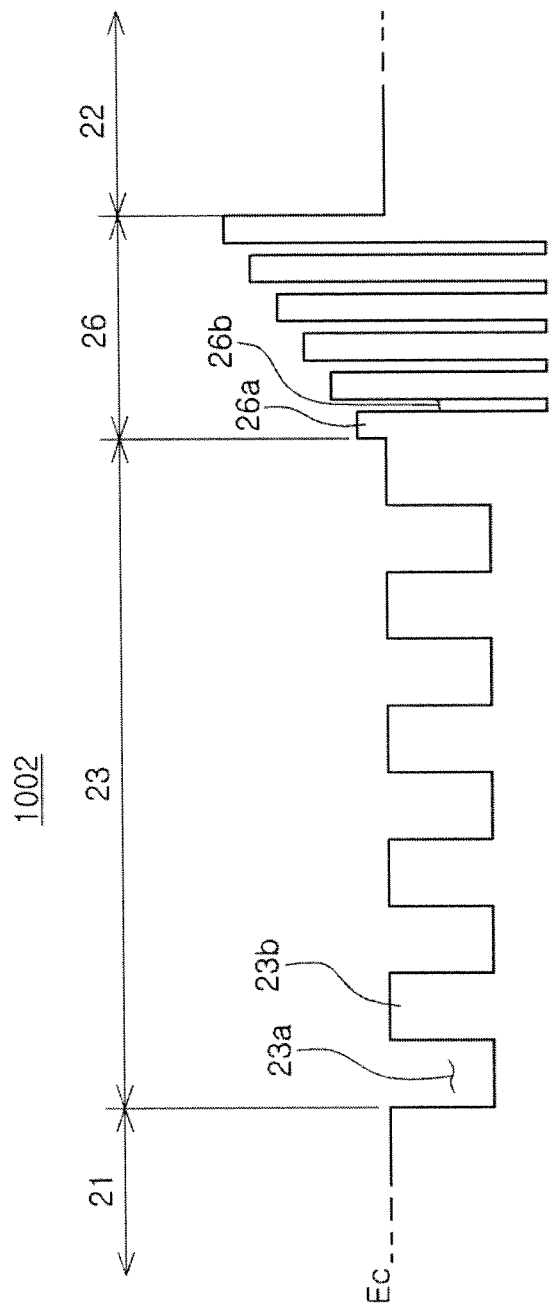

FIGS. 7A and 7B are energy band diagrams of semiconductor light emitting devices 1001 and 1002 according to an exemplary embodiment of the present disclosure modified from FIG. 1. In FIGS. 7A and 7B, only a conduction band of an energy band diagram is illustrated. Hereinafter, descriptions of components the same as those of the previous exemplary embodiment described above will be omitted and only different parts will be described.

Referring to FIG. 7A, an electron blocking layer 25 includes a plurality of first regions 25a, and the content of aluminum (Al) of the plurality of first regions 25a may decrease in a direction from an interface of the electron blocking layer 25 contiguous with an active layer 23 toward an interface of the electron blocking layer 25 contiguous with a p-type semiconductor layer (e.g., a second conductivity-type semiconductor layer 22).

For example, the plurality of first regions 25a may be formed of $Al_xGa_{1-x}N$, where $0<x\leq1$, and, among the plurality of first regions 25a, the first region 25a closer to the p-type semiconductor layer has a smaller x value, the content of aluminum (Al). In this case, the electron blocking layer 25 may block overflow of electrons and guarantee more effective mobility of holes.

Referring to FIG. 7B, an electron blocking layer 26 includes a plurality of first regions 26a, and the content of aluminum (Al) of the plurality of first regions 26a may increase in a direction from an interface of the electron blocking layer 26 contiguous with the active layer 23 toward an interface of the electron blocking layer 26 contiguous with a p-type semiconductor layer (e.g., the second conductivity-type semiconductor layer 22). For example, the plurality of first regions 26a may be formed of $Al_xGa_{1-x}N$, where $0<x\leq1$, and, among the plurality of first regions 26a, the first region 26a closer to the p-type semiconductor layer has a greater x value, the content of aluminum (Al). In this case, the electron blocking layer 26 may reduce a sudden change in the composition of the semiconductor layer in the interface between the electron blocking layer 26 and the active layer 23 and reduce piezoelectric polarization due to a difference in lattice constants more effectively.

Figure 8:
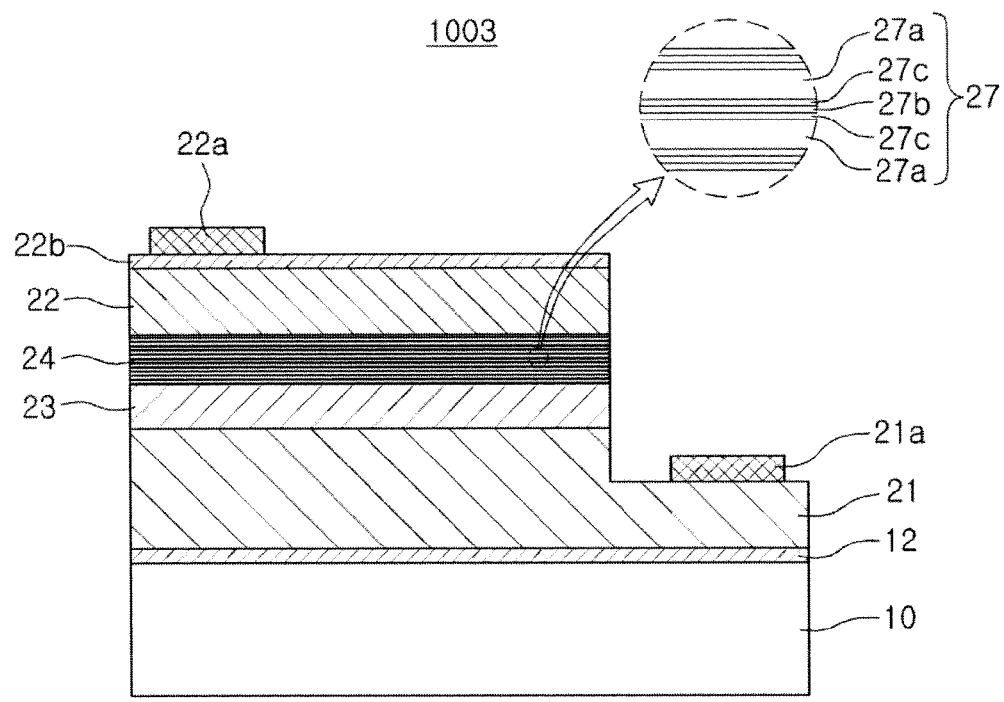
FIG. 8 is a cross-sectional view schematically illustrating a semiconductor light emitting device according to an exemplary embodiment of the present disclosure modified from FIG. 1.

FIG. 8 is a cross-sectional view schematically illustrating a semiconductor light emitting device 1003 according to an exemplary embodiment of the present disclosure modified from FIG. 1.

Referring to FIG. 8, an electron blocking layer 27 according to the present exemplary embodiment may include a plurality of third regions 27c respectively disposed between first regions 27a and second regions 27b. The plurality of third regions 27c may include a semiconductor material formed of $Al_aIn_bGa_{1-a-b}N$, where $0\leq a<x$, $0\leq b<1$, and $0\leq a+b<1$.

In the present exemplary embodiment, the content of aluminum (Al) of the third region 27c may decrease in a direction toward the second region 27b disposed contiguous therewith. Namely, it may be understood that the content of aluminum (Al) decreases in a direction away from the first region 27a including a high content of aluminum (Al) and increases in a direction toward the first region 27a. Similarly, the content of indium (In) of the third region 27c may increase in a direction toward the second region 27b disposed contiguous therewith.

Namely, in the third region 27c disposed between the first region 27a and the second region 27b, the content of aluminum (Al) thereof may decrease and the content of indium (In) thereof may increase in a direction from an interface of the third region 27c contiguous with the first region 27a toward an interface of the third region 27c contiguous with the second region 27b. The third region 27c may serve as a buffering region alleviating a sudden change in the composition between the first region 27a and the second region 27b.

In this case, the electron blocking layer 27 may have a stacked structure in which the first region 27a, the third region 27c, the second region 27b, the third region 27c, and the first region 27a are alternately disposed in this order, and although not limited hereto, the first to third regions 27a to 27c may form a superlattice structure.

Figure 9:
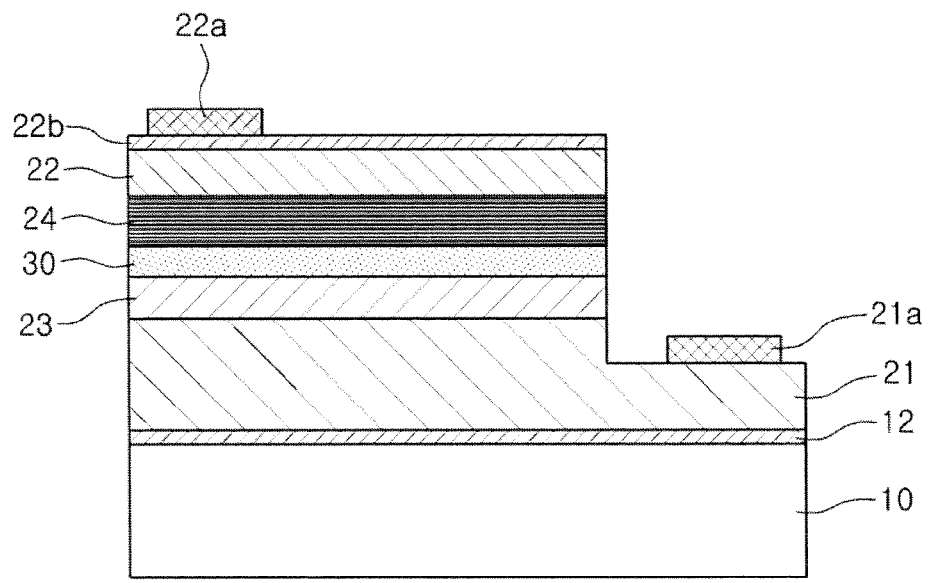
FIG. 9 is a cross-sectional view schematically illustrating a semiconductor light emitting device according to an exemplary embodiment of the present disclosure modified from FIG. 1.
Figure 10:
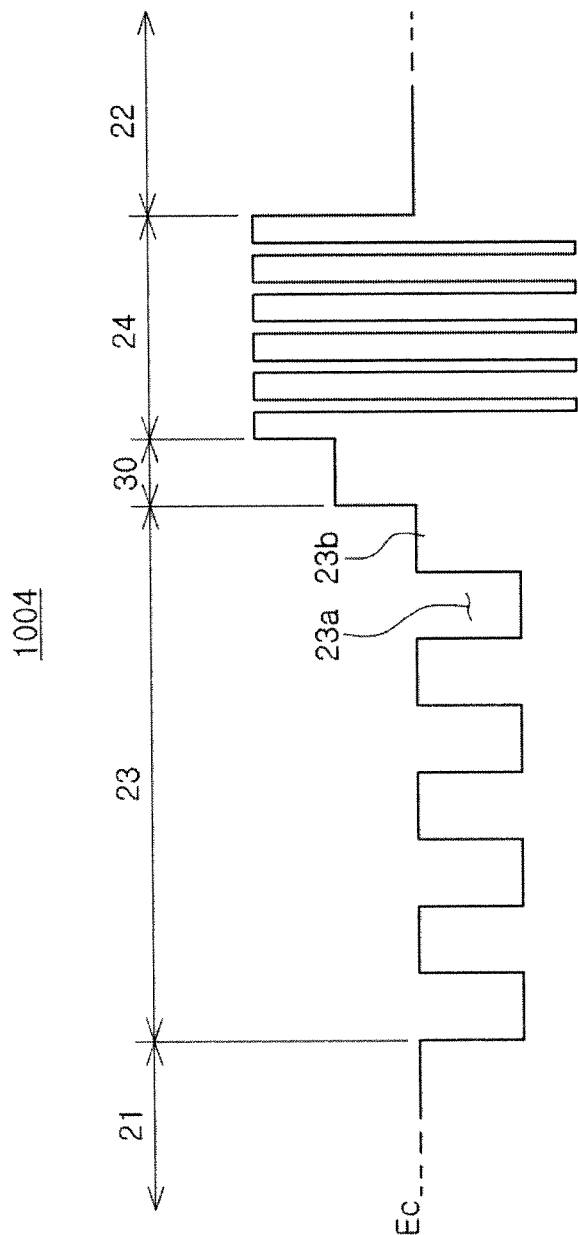
FIG. 10 is an energy band diagram of the semiconductor light emitting device according to the exemplary embodiment of FIG. 9.

FIG. 9 is a cross-sectional view schematically illustrating a semiconductor light emitting device 1004 according to an exemplary embodiment of the present disclosure modified from FIG. 1, and FIG. 10 is an energy band diagram of the semiconductor light emitting device 1004 according to the exemplary embodiment of FIG. 9. In FIG. 10, only a conduction band of the energy band diagram is illustrated.

Referring to FIGS. 9 and 10, the semiconductor light emitting device 1004 according to the present exemplary embodiment may include a diffusion barrier 30 disposed between the active layer 23 and the electron blocking layer 24.

When a p-type dopant element is diffused into the active layer 23, non-radiative recombination may increase and crystallinity of the active layer 23 may be degraded. In order to prevent this, the diffusion barrier 30 may be disposed between the active layer 23 and the electron blocking layer 24 to prevent the p-type dopant element contained in a second conductivity-type semiconductor layer and/or the electron blocking layer 24 from diffusing into the active layer 23.

In order to perform such a function, the diffusion barrier 30 may include a semiconductor material formed of $Al_cIn_dGa_{1-c-d}N$, where $0\leq c\leq1$, $0\leq d\leq1$, $0\leq c+d\leq1$. Although not limited hereto, the diffusion barrier 30 may be formed of an undoped semiconductor. Here, undoped refers to not being doped on purpose.

The content c of aluminum (Al) of the diffusion barrier may be lower than the content x of aluminum (Al) contained in the first region 24a of the electron blocking layer 24.

As illustrated in FIG. 10, an energy band gap of the diffusion barrier 30 may be greater than those of a quantum barrier layer 23b and the second conductivity-type semiconductor layer 22, and may serve to effectively suppress overflow of electrons together with the electron blocking layer 24.

Since the diffusion barrier 30 prevents diffusion of the p-type dopant element, the concentration of the p-type dopant element in the electron blocking layer 24 or the second conductivity-type semiconductor layer 22 may increase, and thus, the concentration of the p-type dopant element may be sufficiently secured to increase the number of holes participating in light emission, enhancing luminous characteristics.

Figure 11:
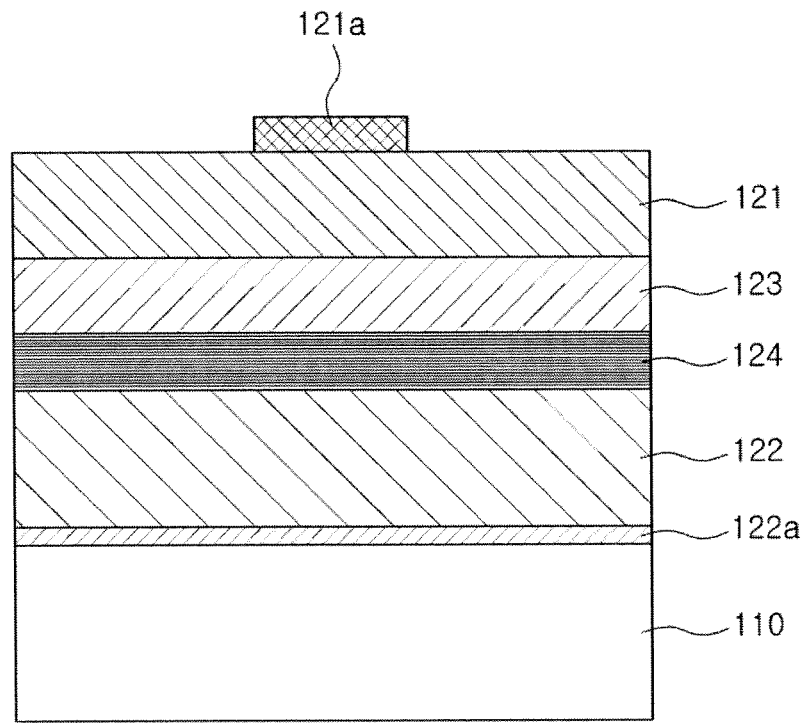
FIGS. 11 through 13 are cross-sectional views schematically illustrating various semiconductor light emitting devices employable in an exemplary embodiment of the present disclosure.
Figure 12:
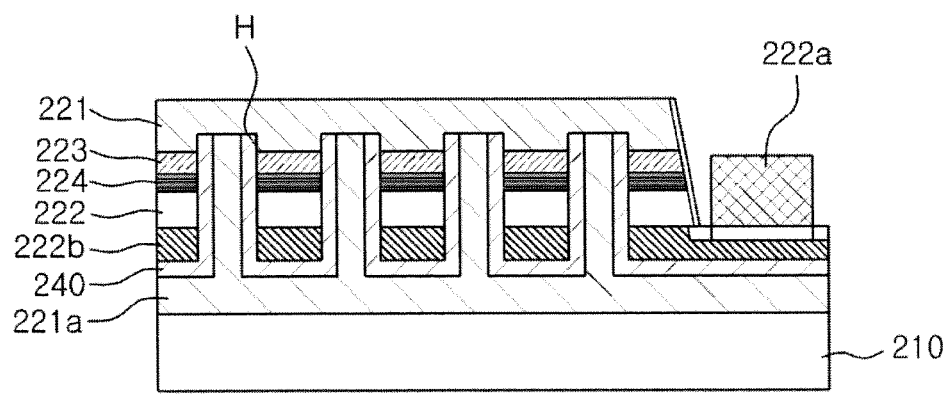
Figure 13:
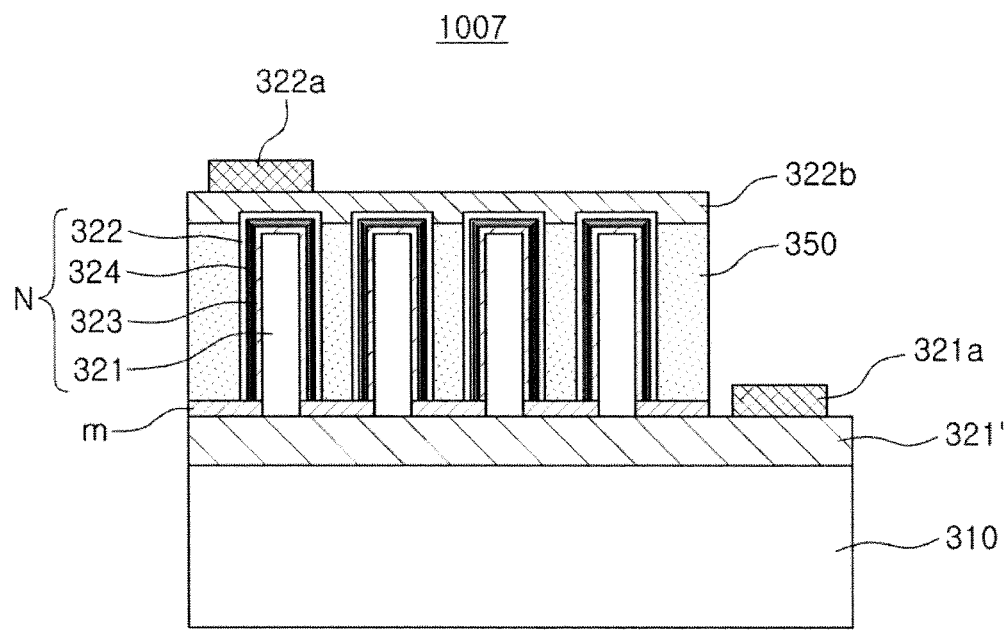

FIGS. 11 through 13 are cross-sectional views schematically illustrating various semiconductor light emitting devices employable in an exemplary embodiment of the present disclosure.

Referring to FIG. 11, a semiconductor light emitting device 1005 according to the present exemplary embodiment includes a second conductivity-type semiconductor layer 122, an active layer 123, and a first conductivity-type semiconductor layer 121. In the present exemplary embodiment, an electron blocking layer 124 may be disposed between the active layer 123 and the second conductivity-type semiconductor layer 122. The electron blocking layer 124 may include the materials and have the energy band described above. Accordingly, luminous characteristics may be improved.

The first conductivity-type semiconductor layer 121 may be, for example, an n-type semiconductor layer, and a first electrode 121a is formed thereon. The second conductivity-type semiconductor layer 122 may be, for example, a p-type semiconductor layer and a reflective metal layer 122a may be formed between the second conductivity-type semiconductor layer 122 and a conductive substrate 110. The reflective metal layer 122a may be formed of a material exhibiting electrical ohmic-characteristics with respect to the second conductivity-type semiconductor layer 122, and may be formed of a metal having a high degree of reflectivity. In consideration of this function, the reflective metal layer 122a may include silver (Ag), nickel (Ni), aluminum (Al), rhodium (Rh), palladium (Pd), iridium (Ir), ruthenium (Ru), magnesium (Mg), zinc (Zn), platinum (Pt), or gold (Au).

The conductive substrate 110 may be connected to an external power source to apply driving power to the second conductivity-type semiconductor layer 122. In addition, the conductive substrate 110 may serve as a support of the light emitting device during a process such as a laser lift-off (LLO), or the like, for removal of a growth substrate used for the growth of the semiconductor. Although not limited hereto, the conductive substrate 110 may be formed of a material including at least one selected from the group consisting of gold (Au), nickel (Ni), aluminum (Al), copper (Cu), tungsten (W), silicon (Si), selenium (Se), and gallium arsenide (GaAs). For example, the conductive substrate 110 may be formed as a silicon substrate doped with aluminum (Al). In this case, the conductive substrate 110 may be formed on the reflective metal layer through a process such as plating, sputtering, or deposition. Alternatively, a previously fabricated conductive substrate 110 may be bonded to the reflective metal layer 122a by a conductive bonding layer, or the like.

FIG. 12 illustrates a different type of semiconductor light emitting device according to an exemplary embodiment of the present disclosure.

Referring to FIG. 12, the semiconductor light emitting device 1006 according to the present exemplary embodiment may include a first conductivity-type semiconductor layer 221, an active layer 223, an electron blocking layer 224, a second conductivity-type semiconductor layer 222, a second electrode layer 222b, an insulating layer 240, a first electrode layer 221a, and a substrate 210 and those layers are sequentially stacked. Here, the electron blocking layer 224 includes the materials and have the energy band described above, and accordingly, light emitting characteristics may be improved. In addition, according to the present exemplary embodiment, current spreading efficiency may be enhanced and an advantageous effect may be obtained in terms of heat dissipation.

In order to be electrically connected to the first conductivity-type semiconductor layer 221, the first electrode layer 221a includes one or more contact holes H extending from one surface of the first electrode layer 221a to at least a partial region of the first conductivity-type semiconductor layer 221 and electrically insulated from the second conductivity-type semiconductor layer 222 and the active layer 223. However, the first electrode layer 221a is not an essential element in the present exemplary embodiment.

The contact holes H may extend from an interface of the first electrode layer 221a, penetrating through the second electrode layer 222b, the second conductivity-type semiconductor layer 222, the electron blocking layer 224, and the active layer 223, to the interior of the first conductivity-type semiconductor layer 221. The contact holes H may extend at least to an interface between the active layer 223 and the first conductivity-type semiconductor layer 221 and, preferably, extend to a portion of the first conductivity-type semiconductor layer 221. However, since the contact holes H are formed for electrical connectivity and current spreading of the first conductivity-type semiconductor layer 221, the purpose of the presence of the contact holes H is achieved when the contact holes H are in contact with the first conductivity-type semiconductor layer 221. Thus, it is not necessary for the contact holes H to extend to an external surface of the first conductivity-type semiconductor layer 221.

The second electrode layer 222b formed on the second conductivity-type semiconductor layer 222 may be formed of a material selected from the group consisting of silver (Ag), nickel (Ni), aluminum (Al), rhodium (Rh), palladium (Pd), iridium (Ir), ruthenium (Ru), magnesium (Mg), zinc (Zn), platinum (Pt), and gold (Au) in consideration of a light reflecting function and an ohmic-contact function with respect to the second conductivity-type semiconductor layer 222, and may be formed by using a process such as sputtering, deposition, and the like. The second electrode layer 222b may be electrically connected to the second electrode 222a so that driving power may be applied.

The contact holes H may penetrate through the second electrode layer 222b, the second conductivity-type semiconductor layer 222, the electron blocking layer 224, and the active layer 223 so as to be connected to the first conductivity-type semiconductor layer 221. The contact holes H may be formed through an etching process, e.g., inductively coupled plasma-reactive ion etching (ICP-RIE), or the like.

The insulator 240 is formed to cover side walls of the contact holes H and a surface of the second conductivity-type semiconductor layer 222. In this case, at least a portion of the first conductivity-type semiconductor layer 221 corresponding to lower surfaces of the contact holes H may be exposed. The insulator 240 may be formed by depositing an insulating material such as $SiO_2$, $SiO_xN_y$, or $Si_xN_y$.

The first electrode layer 221a including a conductive via formed by filling a conductive material may be formed within the contact holes H. Subsequently, the substrate 210 may be formed on the first electrode layer 221a. In this structure, the substrate 210 may be electrically connected to the first conductivity-type semiconductor layer 221 by the conductive via connected to the first conductivity-type semiconductor layer 221.

The substrate 210 may be formed of a material including one selected from the group consisting of Au, Ni, Al, Cu, W, Si, Se, GaAs, SiAl, Ge, SiC, AlN, $Al_2O_3$, GaN, and AlGaN and may be formed by a process such as plating, sputtering, deposition, bonding, or the like without being limited thereto.

In order to reduce contact resistance, the amount, shape, pitch, and contact areas of the contact holes H with the first and second conductivity-type semiconductor layers 221 and 222, and the like, may be appropriately regulated. The contact holes H may be arranged in various ways forming rows and columns to improve current flow. In this case, the conductive via may be surrounded by the insulator 240 so as to be electrically separated from the active layer 223 and the second conductivity-type semiconductor layer 222.

FIG. 13 is a cross-sectional view illustrating a different type semiconductor light emitting device according to an exemplary embodiment of the present disclosure. A semiconductor light emitting device 1007 according to the present exemplary embodiment may be understood as a semiconductor light emitting device implemented as a so-called "nano-LED" including nanostructures.

In detail, referring to FIG. 13, a semiconductor light emitting device 1007 includes a plurality of light emitting nanostructures N formed on a substrate 310. In the present exemplary embodiment, it is illustrated that the light emitting nanostructures N have a rod structure as a core-shell structure, but the structure of the light emitting nanostructures is not limited thereto, and the light emitting nanostructures may have any other structure such as a pyramid structure.

The semiconductor light emitting device 1007 includes a base semiconductor layer 321' formed on the substrate 310. The base semiconductor layer 321', a layer providing a growth surface for the light emitting nanostructures N, may be a first conductivity-type semiconductor layer. A mask layer m with openings for the growth of the light emitting nanostructures (in particular, cores) may be formed on the base semiconductor layer 321'. The mask layer m may be formed of a dielectric material such as $SiO_2$ or $SiN_x$.

In each of the light emitting nanostructures N, a first conductivity-type nanocore 321 is formed by selectively growing a first conductivity-type semiconductor by using the mask layer m with the openings, and an active layer 323, an electron blocking layer 324, and a second conductivity-type semiconductor layer 322 are formed as shell layers on a surface of the nanocore 321. Accordingly, each of the light emitting nanostructures N may have a core-shell structure in which the first conductivity-type semiconductor is the nanocore and the active layer 323, the electron blocking layer 324, and the second conductivity-type semiconductor layer 322 enclosing the nanocore are shell layers.

The electron blocking layer 324 includes the materials and have the energy band described above, and accordingly, light emitting characteristics may be improved.

The semiconductor light emitting device 1007 according to the present exemplary embodiment includes a filler material 350 filling spaces between the light emitting nanostructures N. The filler material 350 may structurally stabilize the light emitting nanostructures N. The filler material 350 may be formed of a transparent material such as $SiO_2$ or the like, but the material of the filler material 350 is not limited thereto. An ohmic-contact layer 322b may be formed on the light emitting nanostructures N and connected to the second conductivity-type semiconductor layer 322. The semiconductor light emitting device 1007 includes first and second electrodes 321a and 322a connected to the base semiconductor layer 321' formed of the first conductivity-type semiconductor and the ohmic-contact layer 322b, respectively.

By forming the light emitting nanostructures N such that they have different diameters, components, and doping concentrations, light having two or more different wavelengths may be emitted from a single device. By appropriately adjusting light having different wavelengths, white light may be produced in the single device without using phosphors, and light having various desired colors or white light having different color temperatures may be produced by combining the foregoing device with a different light emitting device or wavelength conversion materials such as phosphors.

Figure 14:
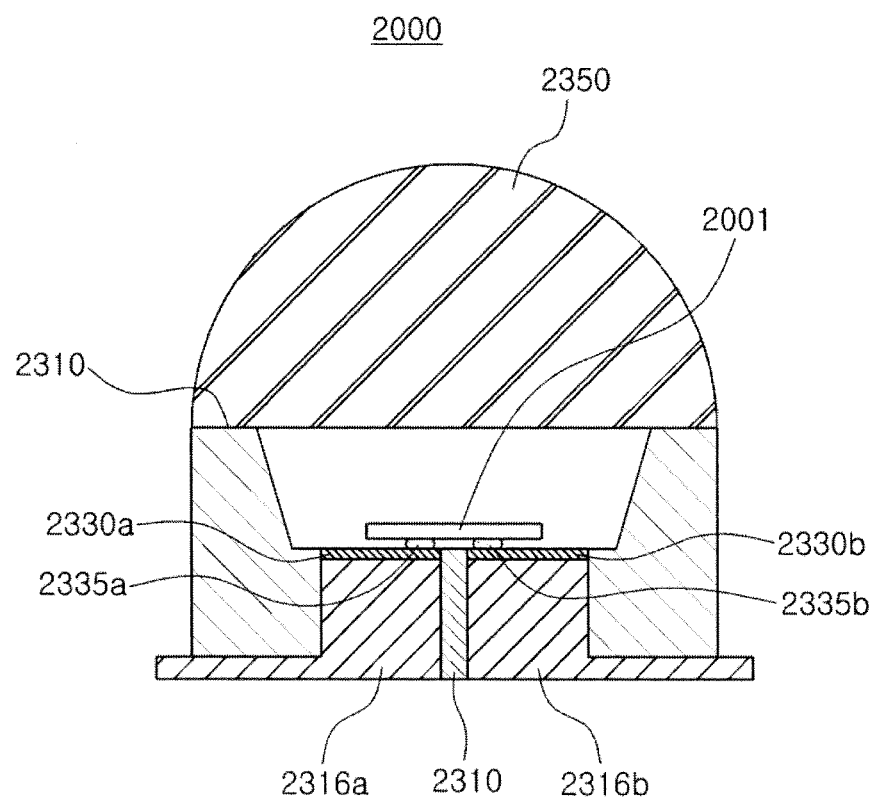
FIG. 14 is a cross-sectional view illustrating an example of a package including a semiconductor light emitting device according to an exemplary embodiment of the present disclosure.

FIG. 14 is a cross-sectional view illustrating an example of a package including a semiconductor light emitting device according to an exemplary embodiment of the present disclosure.

Referring to FIG. 14, a light emitting device package 2000 according to the present exemplary embodiment includes a semiconductor light emitting device 2001 and first and second package electrodes 2316a and 2316b provided below the semiconductor light emitting device 2001 to allow the semiconductor light emitting device 2001 to be attached thereto. Here, the semiconductor light emitting devices according to various exemplary embodiments as described above may be used as the semiconductor light emitting device 2001. The semiconductor light emitting device 2001 may be attached to the first and second package electrodes 2316a and 2316b through flipchip bonding.

The first and second package electrodes 2316a and 2316b may be separately provided so that they serve to apply a driving voltage to the semiconductor light emitting device 2001 and dissipate heat generated by the semiconductor light emitting device 2001. To this end, first and second bonding metals 2335a and 2335b may be interposed between the light emitting device 2001 and the first package electrode 2316a and between the semiconductor light emitting device 2001 and the second package electrode 2316b, respectively. Here, the bonding metals 2335a and 2335b may be solder formed of a gold (Au)-tin (Sn) alloy, a tin (Sn)-silver (Ag) alloy, or the like, or a metal such as gold (Au), copper (Cu), or the like. Meanwhile, the semiconductor light emitting device 2001 may be attached to the first and second package electrodes 2316a and 2316b with a conductive adhesive.

Preferably, reflective layers 2330a and 2330b may be coated on the first and second package electrodes 2316a and 2316b to which the semiconductor light emitting device 2001 is attached in order to reflect light generated by the semiconductor light emitting device 2001 in the upward direction from the semiconductor light emitting device 2001. Here, the reflective layers 2330a and 2330b may be formed of silver (Ag), aluminum (Al), and the like.

The first and second package electrodes 2316a and 2316b are supported by a package housing 2310. Here, the package housing 2310 may be formed of a material stable at high temperatures or a heat-resistant insulating material such as a ceramic, or the like. Meanwhile, the package housing 2310 is also provided between the first and second package electrodes 2316a and 2316b to electrically insulate the first package electrode 2316a and the second package electrode 2316b. A lens 2350 serving to collect or distribute light generated by the semiconductor light emitting device 2001 may be formed on the package housing 2310. As illustrated, the lens 2350 may be a dome-type lens, or various other types of lenses, such as a flat-type lens, or the like, may also be used.

Figure 15:
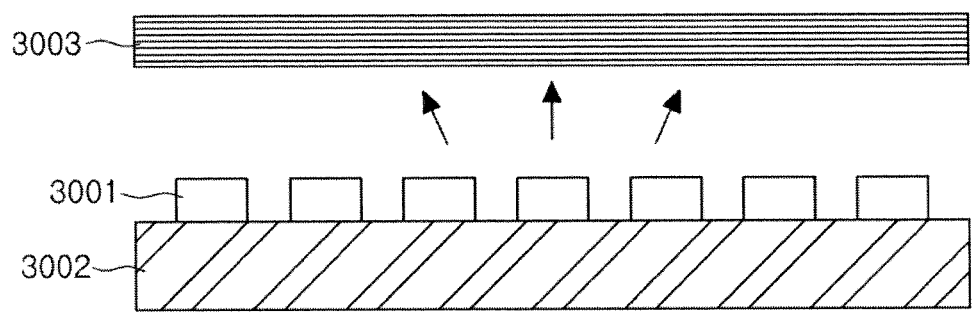
FIGS. 15 and 16 are cross-sectional views illustrating examples of a backlight unit including a semiconductor light emitting device according to an exemplary embodiment of the present disclosure.
Figure 16:
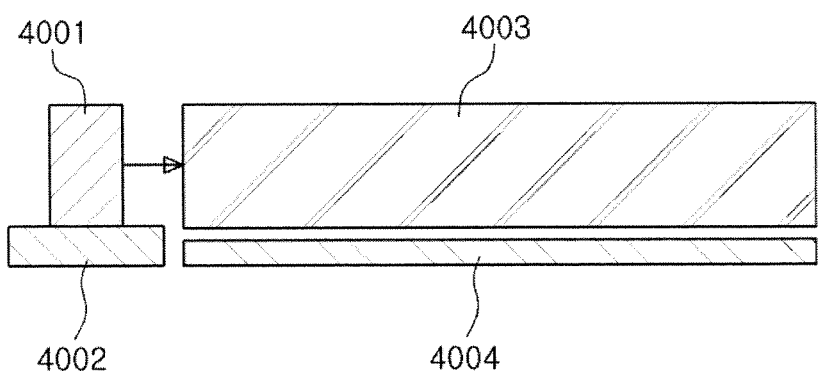

FIGS. 15 and 16 are cross-sectional views illustrating examples of a backlight unit including a semiconductor light emitting device according to an exemplary embodiment of the present disclosure.

Referring to FIG. 15, in a backlight unit 3000, light sources 3001 are mounted on a board 3002, and one or more optical sheets 3003 are disposed thereabove. The light sources 3001 may be provided as a so-called chip-on-board (COB) type by directly mounting the foregoing semiconductor light emitting devices on the board 3002. Alternatively, the light emitting device package 2000 may be used.

Unlike the backlight unit 3000 illustrated in FIG. 15 in which the light sources 3001 emit light toward an upper side where an LCD is disposed, in a backlight unit 4000 according to another example illustrated in FIG. 16, a light source 4001 mounted on a board 4002 emits light in a lateral direction, and the emitted light is incident to a light guide plate 4003 so as to be changed into a surface light source. Light passing through the light guide plate 4003 is emitted upwardly, and in order to enhance light extraction efficiency, a reflective layer 4004 may be disposed below the light guide plate 4003.

Figure 17:
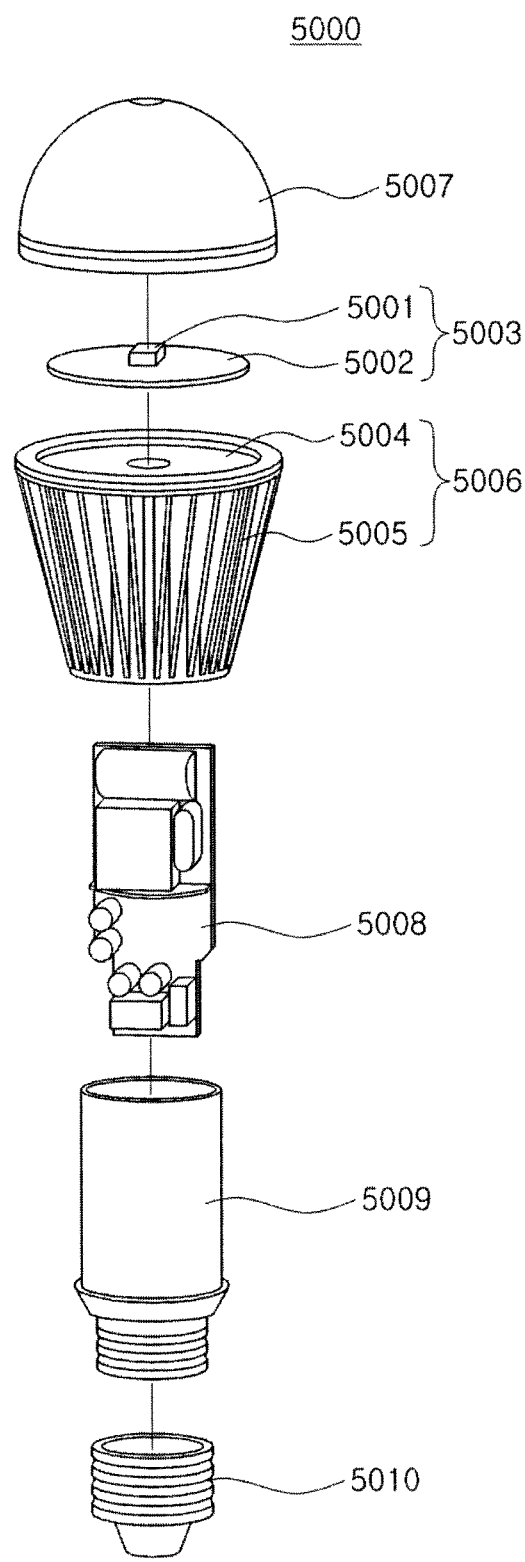
FIGS. 17 and 18 are exploded perspective views illustrating examples of a lighting device including a semiconductor light emitting device according to an exemplary embodiment of the present disclosure.
Figure 18:
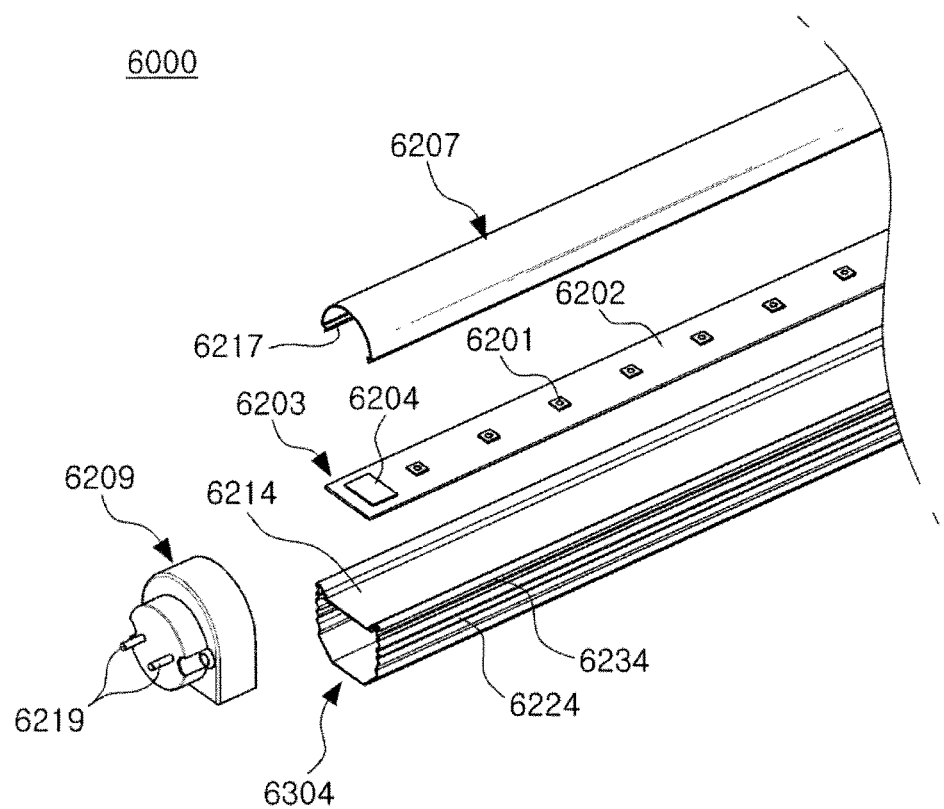

FIGS. 17 and 18 are exploded perspective views illustrating examples of a lighting device including a semiconductor light emitting device according to an exemplary embodiment of the present disclosure.

Referring to the exploded perspective view of FIG. 17, a lighting device 5000 is illustrated as, for example, a bulb type lamp, including a light emitting module 5003, a driving unit 5008, and an external connection unit 5010. In addition, the lighting device 5000 may further include external structures such as external and internal housings 5006 and 5009 and a cover unit 5007. The light emitting module 5003 may include a light source 5001 and a circuit board 5002 on which the light source 5001 is mounted. As the light source 5001, the semiconductor light emitting device or the light emitting device package according to the previous exemplary embodiment described above may be used.

In the present exemplary embodiment, a single light source 5001 is illustrated as being mounted on the circuit board 5002, but a plurality of light sources may be mounted as necessary.

In addition, in the lighting device 5000, the light emitting module 5003 may include an external housing 5006 serving as a heat dissipation unit, and the external housing 5006 may include a heat dissipation plate 5004 disposed in direct contact with the light emitting module 5003 to enhance a heat dissipation effect. Furthermore, the lighting device 5000 may include a cover unit 5007 installed on the light emitting module 5003 and having a convex lens shape. The driving unit 5008 may be installed in the internal housing 5009 and connected to an external connection unit 5010 having a socket structure to receive power from an external power source. In addition, the driving unit 5008 may serve to convert received power into an appropriate current source for driving the light source 5001 of the light emitting module 5003 and provide the same. For example, the driving unit 5008 may be configured as an AC-DC converter, a rectifying circuit component, and the like.

Meanwhile, a lighting device 6000 including a light source device according to an exemplary embodiment may be a bar-type lamp as illustrated in FIG. 18. Although not limited hereto, the lighting device 6000 may have a shape similar to that of a fluorescent lamp to replace a conventional fluorescent lamp, and may emit light having optical characteristics similar to those of a fluorescent lamp.

Referring to the exploded perspective view of FIG. 18, the lighting device 6000 according to the present exemplary embodiment may include a light source unit 6203, a body unit 6304, and a driving unit 6209. The lighting device 6000 may further include a cover unit 6207 covering the light source unit 6203.

The light source unit 6203 may include a board 6202 and a plurality of LEDs 6201 mounted on the board 6202. As the light source 6201, the semiconductor light emitting device or the light emitting device package according to the former exemplary embodiment described above may be used.

The body unit 6304 may allow the source unit 6203 to be fixed to one surface thereof. The body unit 6304, a type of support structure, may include a heat sink. The body unit 6304 may be formed of a material having excellent heat conductivity to dissipate heat generated by the light source unit 6203 outwardly. For example, the body unit 6304 may be formed of a metal, but the material of the body unit 6304 is not limited thereto.

The body unit 6304 may have an elongated bar-like shape corresponding to the shape of the board 602 of the light source unit 6202 on the whole. A recess 6214 may be formed in one surface of the body unit 6304 on which the light source unit 6203 is mounted, in order to accommodate the light source unit 2203 therein.

A plurality of heat dissipation fins 6224 may protrude from at least one outer surface of the body unit 6304 to dissipate heat. Stopping recesses 6234 may be formed in at least one end of the outer surface positioned in an upper portion of the recess 6214, and extend in a length direction of the body unit 6304. The cover unit 6207 as described hereinafter may be fastened to the stopping recesses 6234.

At least one of end portions of the body unit 6304 in the length direction thereof may be open, so the body unit 6304 may have a pipe structure with at least end portion thereof open.

The driving unit 6209 may be provided on at least one open side of at least one end portion of the body unit 6304 in the length direction to supply driving power to the light source unit 6203. In the present exemplary embodiment, it is illustrated that at least one end portion of the body unit 6304 is open, so the driving unit 6209 is disposed in at least one end portion of the body unit 6304. The driving unit 6209 may be fastened to at least one open end portion of the body unit 6304 to cover the same. The driving unit 2209 may include electrode pins 6219 protruding externally.

The cover unit 6207 may be fastened to the body unit 6304 to cover the light source unit 6203. The cover unit 6207 may be formed of a material allowing light to be transmitted therethrough.

The cover unit 6207 may have a curved surface having a semicircular shape to allow light to be uniformly irradiated externally on the whole. A protrusion 6217 may be formed in a length direction of the cover unit 6207 on the bottom of the cover unit 6207 fastened to the body unit 6304, and engaged with the stopping recess 6234 of the body unit 6304.

In the present exemplary embodiment, the cover unit 6207 has a semicircular shape, but the shape of the cover unit 6207 is not limited thereto. For example, the cover unit 6207 may have a flat quadrangular shape or may have any other polygonal shape. The shape of the cover unit 6207 may be variously modified according to designs of illumination for irradiating light.

Figure 19:
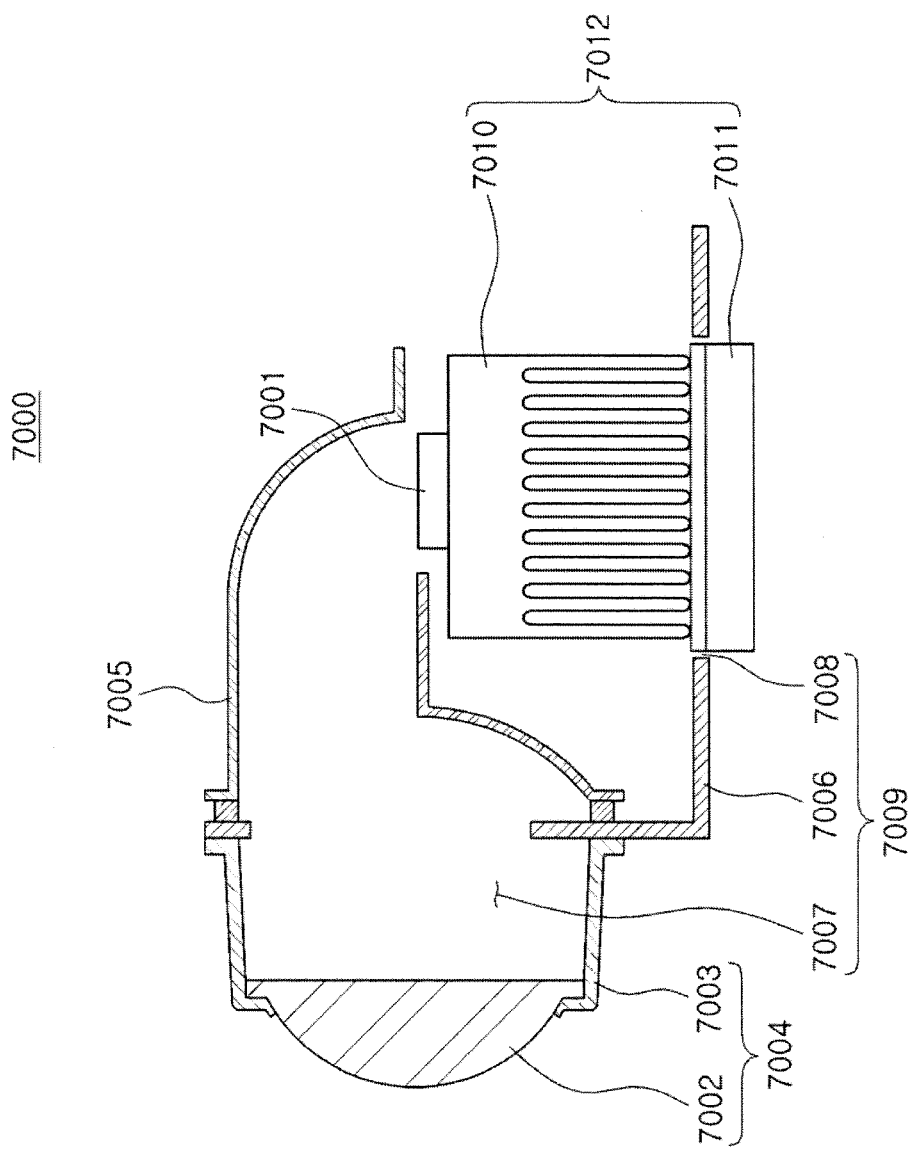
FIG. 19 is a cross-sectional view illustrating an example of a headlamp including a semiconductor light emitting device according to an exemplary embodiment of the present disclosure.

FIG. 19 is a cross-sectional view illustrating an example of a headlamp including a semiconductor light emitting device according to an exemplary embodiment of the present disclosure.

Referring to FIG. 19, a head lamp 7000 used as a vehicle lamp, or the like, may include a light source 7001, a reflective unit 7005, and a lens cover unit 7004. The lens cover unit 7004 may include a hollow guide 7003 and a lens 7002. As the light source 7001, the semiconductor light emitting device or the light emitting device package according to the previous exemplary embodiment described above may be used.

The head lamp 7000 may further include a heat dissipation unit 7012 dissipating heat generated by the light source 7001 externally. In order to dissipate heat effectively, the heat dissipation unit 7012 may include a heat sink 7010 and a cooling fan 7011.

The head lamp 6000 may further include a housing 7009 fixedly supporting the heat dissipation unit 7012 and the reflective unit 7005. The housing 7009 may have a central hole 7008 formed on one surface thereof, in which the heat dissipation unit 7012 is coupled.

The housing 7009 may have a front hole 7007 formed on the other surface integrally connected to the one surface and bent in a right angle direction. The front hole 7007 may allow the reflective unit 7005 to be fixedly positioned above the light source 7001. Accordingly, a front side is opened by the reflective unit 7005, and the reflective unit 7005 is fixed to the housing 7009 such that the opened front side corresponds to the front hole 7007, and light reflected from the reflective unit 7005 may pass through the front hole 7007 so as to be emitted externally.

As set forth above, according to an exemplary embodiment of the present disclosure, a semiconductor light emitting device having improved luminous efficiency may be obtained.

Also, according to an exemplary embodiment of the present disclosure, a semiconductor light emitting device having improved driving voltage characteristics may be obtained.

While exemplary embodiments have been shown and described above, it will be apparent to those skilled in the art that modifications and variations could be made without departing from the scope of the present invention as defined by the appended claims.

What is claimed is:
1. A semiconductor light emitting device comprising:
an n-type semiconductor layer and a p-type semiconductor layer;
an active layer disposed between the n-type semiconductor layer and the p-type semiconductor layer; and an electron blocking layer disposed between the active layer and the p-type semiconductor layer and doped with a p-type dopant element, wherein:

the electron blocking; layer is formed of AlxGa1-xN, where 0<x≤1, a plurality of first regions blocking overflow of electrons from the active layer to the p-type semiconductor layer and a plurality of second regions formed of InN are alternately disposed within the electron blocking layer, and content of aluminum (Al) of the plurality of first regions changes in a direction from an interface of the electron blocking layer contiguous with the active layer toward an interface of the electron blocking layer contiguous with the p-type semiconductor layer.

2. The semiconductor light emitting device of claim 1, wherein the plurality of first and second regions are alternately disposed to form a superlattice structure.

3. The semiconductor light emitting device of claim 1, wherein the electron blocking layer further comprises a plurality of third regions formed of AlaInbGa1-a-bN, where 0≤a<x, 0≤b<1, and 0≤a+b<1, and disposed between the first and second regions.

4. The semiconductor light emitting device of claim 3, wherein the content of aluminum (Al) of the third regions decreases in a direction toward the second regions disposed contiguous therewith.

5. The semiconductor light emitting device of claim 3, wherein the content of indium (In) of the third regions increases in a direction toward the second regions disposed contiguous therewith.

6. The semiconductor light emitting device of claim 3, wherein the plurality of first, second and third regions form a superlattice structure.

7. The semiconductor light emitting device of claim 1, further comprising a diffusion barrier disposed between the active layer and the electron blocking layer to prevent the p-type dopant element from being diffused into the active layer.

8. The semiconductor light emitting device of claim 7, wherein the diffusion barrier comprises an undoped semiconductor material formed of AlcIndGa1-c-dN, where 0≤c≤1, 0≤d≤1, and 0≤c+d≤1.

9. The semiconductor light emitting device of claim 1, wherein the content of aluminum (Al) of the plurality of first regions decreases in a direction from an interface of the electron blocking layer contiguous with the active layer toward an interface of the electron blocking layer contiguous with the p-type semiconductor layer.

10. The semiconductor light emitting device of claim 1, wherein the content of aluminum (Al) of the plurality of first regions increases in a direction from an interface of the electron blocking layer contiguous with the active layer toward an interface of the electron blocking layer contiguous with the p-type semiconductor layer.

11. The semiconductor light emitting device of claim 1, wherein the p-type dopant element includes magnesium (Mg).

12. The semiconductor light emitting device of claim 1, further comprising a base semiconductor layer and a mask layer disposed on the base semiconductor layer, the mask layer including a plurality of openings exposing portions of the base semiconductor layer therethrough, wherein:

the n-type semiconductor layer includes nanocores disposed in each of the exposed regions of the base semiconductor layer, and the active layer, the electron blocking layer, and the p-type semiconductor layer are sequentially disposed on lateral surfaces of the nanocores.

13. The semiconductor light emitting device of claim 12, wherein the base semiconductor layer is formed of an n-type semiconductor material.

14. A semiconductor light emitting device comprising:

a first conductivity-type semiconductor layer;

an active layer disposed on the first conductivity-type semiconductor layer;

an electron blocking layer disposed on the active layer and doped with a second conductivity-type dopant element; and a second conductivity-type semiconductor layer disposed on the electron blocking layer, wherein the electron blocking layer includes a plurality of first regions formed of AlxGa1-xN, where 0<x≤1, and a plurality of second regions formed of InN and disposed between the plurality of first regions, and wherein a content of aluminum (Al) of the plurality of first regions changes in a direction from an interface of the electron blocking layer contiguous with the active layer toward an interface of the electron blocking layer contiguous with the p-type semiconductor layer.

15. The semiconductor light emitting device of claim 14, wherein the first and second conductivity-type semiconductor layers are formed of an n type and a p type semiconductor materials, respectively.

16. A semiconductor light emitting device comprising:

a first conductivity-type semiconductor layer and a second conductivity-type semiconductor layer;

an active layer disposed between the first conductivity-type semiconductor layer and the second conductivity-type semiconductor layer; and an electron blocking layer doped with a p-type dopant element and disposed between the active layer and the second conductivity-type semiconductor layer, wherein:

the electron blocking layer comprises a plurality of first regions and a plurality of second regions alternately disposed, an energy band gap of the second conductivity-type semiconductor layer is less than an energy band gap of the first regions and is greater than an energy band gap of the second regions, and a content of aluminum (Al) of the plurality of first regions changes in a direction from an interface of the electron blocking layer contiguous with the active layer toward an interface of the electron blocking layer contiguous with the second conductivity-type semiconductor layer.

17. The semiconductor light emitting device of claim 16, wherein the energy band gap of the first regions decreases in a direction from an interface of the electron blocking layer contiguous with the active layer toward an interface of the electron blocking layer contiguous with the second conductivity-type semiconductor layer, or increases in the direction from the interface of the electron blocking layer contiguous with the active layer toward the interface of the electron blocking layer contiguous with the second conductivity-type semiconductor layer.

18. The semiconductor light emitting device of claim 16, wherein the first regions are formed of AlxGa1-xN, where 0<x≤, and the second regions are formed of InN.

19. The semiconductor light emitting device of claim 18, further comprising a diffusion barrier disposed between the active layer and the electron blocking layer,
- wherein the diffusion barrier Comprises an undoped semiconductor material formed of $Al_cIn_dGa_{1-c-d}N$, where $0 \leq c \leq 1$, $0 \leq d \leq 1$, and $0 \leq c+d \leq 1$, and
- wherein the content c of aluminum (Al) of the diffusion barrier is less than the content x of aluminum (Al) contained in the first regions of the electron blocking layer.

20. The semiconductor light emitting device of claim 16, wherein the first regions do not substantially include indium (In) and the second regions substantially include indium (In).

* * * * *